Figure 2:
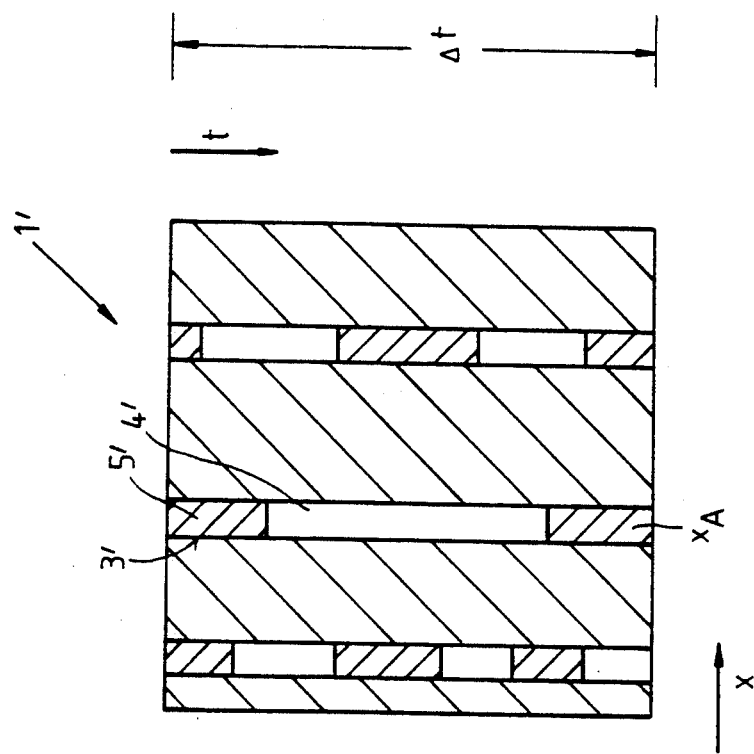

United States Patent [19]

Frosien et al.

[11] Patent Number: 5,231,350
[45] Date of Patent: Jul. 27, 1993

[54] METHOD AND APPARATUS FOR POTENTIAL MEASUREMENT ON CONDUCTIVE TRACKS OF A PROGRAM-CONTROLLED INTEGRATED CIRCUIT

[76] Inventors: Jurgen Frosien, An der Ottosaule 18, 8012 Ottobrunn; Hans R. Tietz, Herbststr. 7, 8035 Gauting, both of Fed. Rep. of Germany

[21] Appl. No.: 626,944

[22] Filed: Dec. 13, 1990

[30] Foreign Application Priority Data

Dec. 19, 1989 [DE] Fed. Rep. of Germany .... 3941889.8

[51] Int. Cl.$^5$ ...................... G01R 31/00; H01J 37/304
[52] U.S. Cl. ............................... 324/158 R; 250/491.1
[58] Field of Search .............. 324/158 R, 158 D, 71.1, 324/71.3; 250/491.1, 310, 311; 364/490, 491

[56] References Cited

U.S. PATENT DOCUMENTS

| | | | |
|---|---|---|---|
| 4,220,853 | 9/1980 | Feuerbaum et al. | 324/158 R |
| 4,420,691 | 12/1983 | Zasio | 250/491.1 |
| 4,442,361 | 4/1984 | Zasio et al. | 250/491.1 |
| 4,516,253 | 5/1985 | Novak | 250/491.1 |
| 4,705,954 | 11/1987 | Rummell et al. | 250/491.1 |
| 4,803,644 | 2/1989 | Frazier | 250/491.1 |
| 4,812,661 | 3/1989 | Owen | 250/491.1 |
| 4,853,870 | 8/1989 | Yasutake et al. | 364/491 |
| 4,961,001 | 10/1990 | Liegel et al. | 250/491.1 |
| 4,967,088 | 10/1990 | Stengel et al. | 250/491.1 |

Primary Examiner—Vinh Nguyen
Attorney, Agent, or Firm—Learman & McCulloch

[57] ABSTRACT

A method and an apparatus for the potential measurement on conductive tracks of a program-controlled integrated circuit. The integrated circuit is scanned by an electron beam in one single scan line crossing at least one conductive track during a specific time range of the program. In an initial auxiliary measurement, the spatial displacement of a logic image caused by electrical and/or magnetic disturbances is determined over time and stored. A principal measurement then takes place during the same time range of the program as the auxiliary measurement. In the principal measurement, an electron beam is directed statically onto the conductive track to be measured and the time dependence of the spatial displacement determined by the auxiliary measurement is used as a compensation value for correcting deflections of the electron beam caused by electrical and/or magnetic disturbances.

3 Claims, 3 Drawing Sheets

METHOD AND APPARATUS FOR POTENTIAL MEASUREMENT ON CONDUCTIVE TRACKS OF A PROGRAM-CONTROLLED INTEGRATED CIRCUIT

The invention relates to a method for potential measurement on conductive tracks of a program-controlled integrated circuit as well as apparatus according to the generic concept of this method.

Methods are known in electron beam measuring technology for potential measurement in integrated circuits. In this case the electron beam is directed onto a fixed point on the relevant conductive track and the resulting secondary electron signal is evaluated in a measurement and control sequence.

With increasing miniaturisation of the integrated circuits and the associated reduction in the width of the conductive track effects occur which hinder potential measurement. Such effects are caused for example by electrical and magnetic fields which can emanate for instance from bonding wires or from high-voltage leads within the circuit. As a result of these disturbances the primary electron beam is no longer fixed on the relevant conductive track but is deflected and can even slide down from the conductive track. This is very disruptive for potential measurement and can make it quite impossible in certain circumstances.

The object of the invention, therefore, is to make further developments to the method for potential measurement on conductive tracks of a program-controlled integrated circuit, in such a way as to compensate for electrical and/or magnetic disturbances in the potential measurement on conductive tracks of integrated circuits.

The object is achieved according to the invention by scanning an integrated circuit by an electron beam in one single scan line crossing at least one conductive track during a specific time range of the program. Spatial displacement of the conductive track occurring in the logic image as a result of electrical and or magnetic disturbances is determined in its time dependence and stored. Then during the same time range of the program, the electron beam is directed statically onto the conductive track to be measured and the time dependence of the spatial displacement determined by scanning the integrated circuit is used as a compensation valve for correction of deficiencies of the electron beam caused by electrical and/or magnetic disturbances.

Further features of the invention are the subject matter of the other claims and are explained in greater detail in connection with the following description and the drawings.

Figure 1:
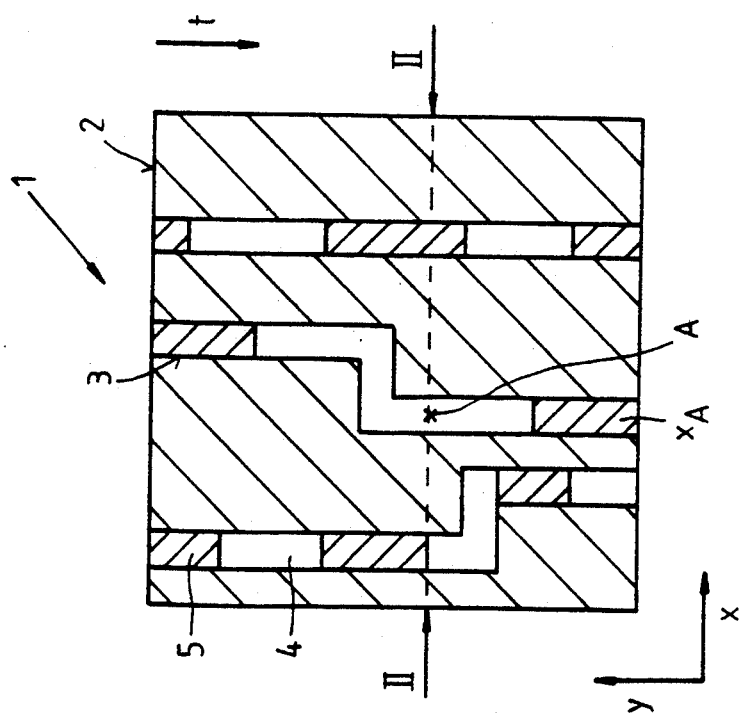
Figure 3:
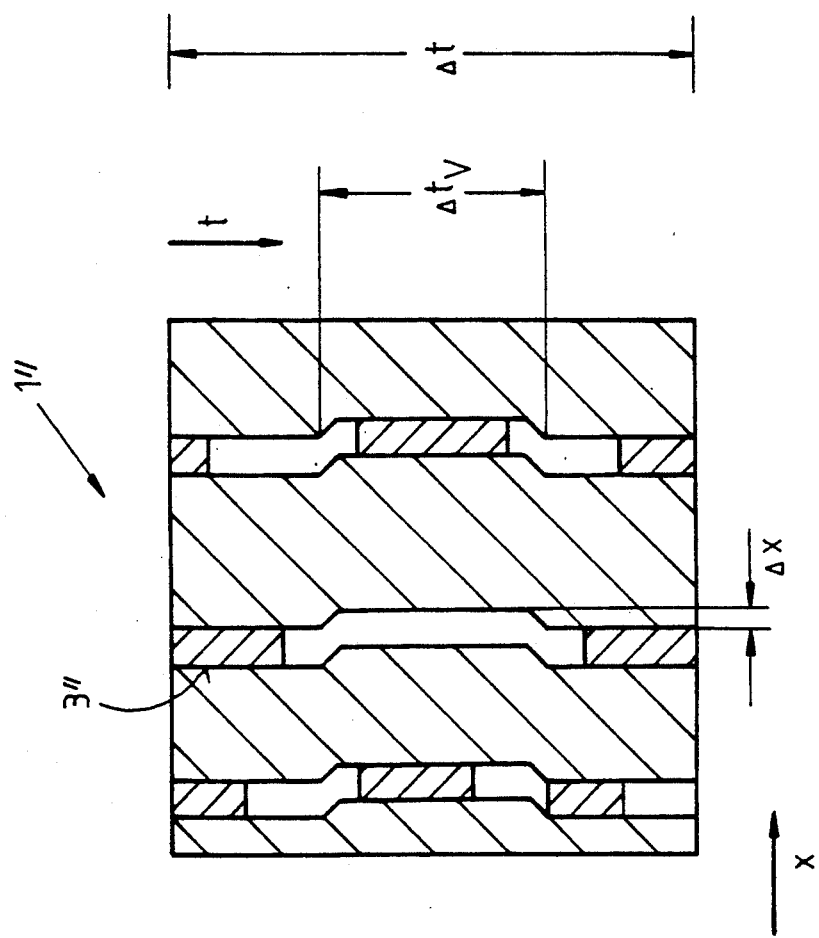
Figure 4:
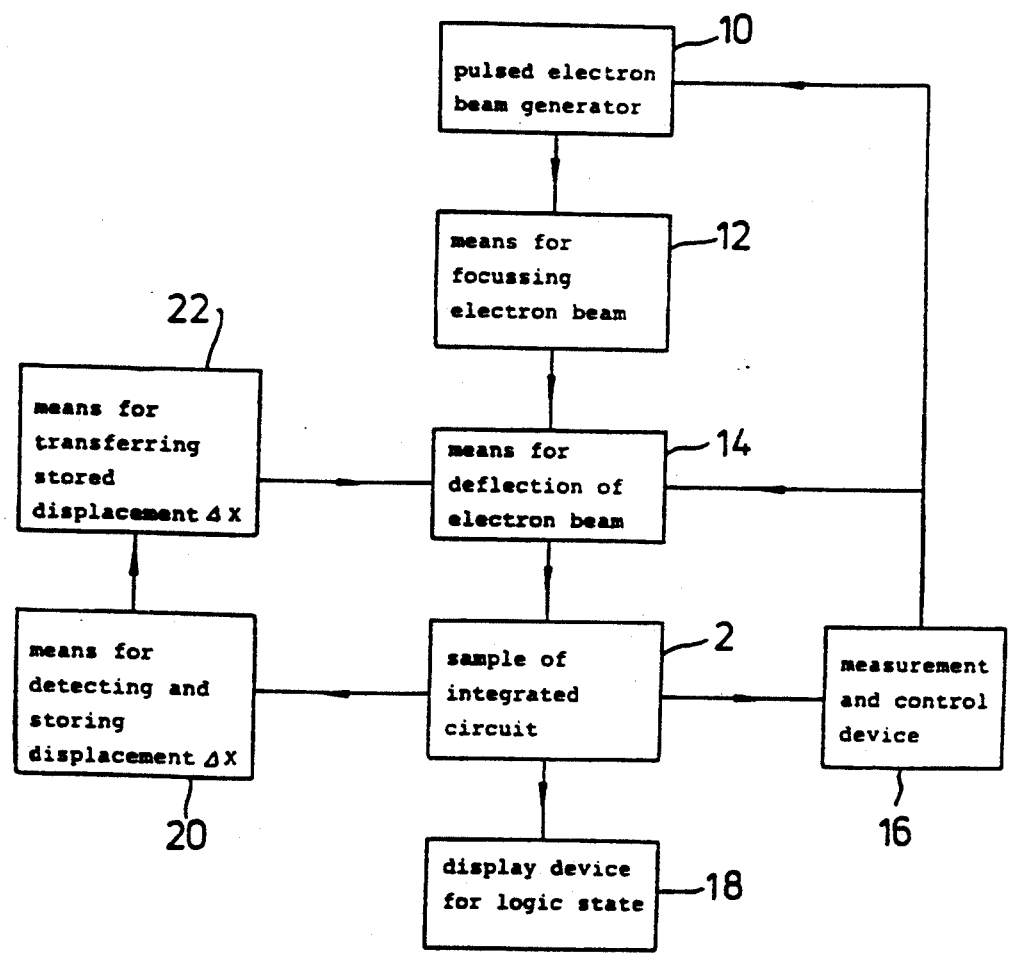

In the drawings:

FIG. 1 shows a representation of a logic image produced by line-by-line scanning of an integrated circuit, FIG. 2 shows a representation of a logic image after scanning of one single line along the line II—II, FIG. 3 shows a representation of a logic image after scanning of one single scan line of an integrated circuit, the line being disturbed by electrical and/or magnetic fields, and FIG. 4 is a block diagram of an apparatus for potential measurement on conductive tracks of a program-controlled integrated circuit.

A two-dimensional logic image 1 of an integrated circuit 2 is shown in FIG. 1. For this purpose a pulsed electron beam from a pulsed electron beam generator 10 is focused by an electron beam focusing assembly 12 onto the integrated circuit 2 at a location selected via an electron beam deflector 14. A measurement and control device 16 detects and evaluates secondary radiation which occurs due to the electron beam impinging upon integrated circuit 2. For potential measurement on conductive tracks 3 the integrated circuit 2 is operated with a program, and during periodic finishing of a program loop the logic states 4,5 occurring at specific points in time are represented in the two-dimensional logic image 1 by means of the electron beam. In this case the electron beam is pulsed with the repetition frequency of the program loop and its phase is continuously shifted. As a result the two-dimensional logic image 1 is produced (x/y axis), overlaid with an additional time axis (t-axis). In this way an accurate reproduction of the surface structure of the integrated circuit 2 is produced.

Let it now be assumed that on a conductive track 3 a specific point A is to be subjected to more accurate measurement.

First of all, in an auxiliary measurement which takes place during a specific time range $\Delta t$ of the program, the integrated circuit 2 is scanned by the electron beam only along the line II—II containing the point A or along another line running at right angles to the time axis.

A logic image 1' according to FIG. 2 then appears on a display device 18. In this case it is a two-dimensional representation, in which on the one hand the place x and on the other hand the time t are plotted. The point A with the co-ordinate $x_A$ of FIG. 1 is shown in FIG. 2 at the x co-ordinate $x_A$ of the conductive track 3' over the entire measured time range $\Delta t$. In addition, on the individual conductive tracks the logic states 4', 5' are illustrated which show the potential development through their light/dark contrast. However, such a representation with conductive tracks 3' running in a straight line, as shown in FIG. 2, is only produced in the ideal case, i.e. without any electrical and/or magnetic disturbances.

With increasing miniaturisation of the integrated circuit 2 and a reducing width of the conductive track, effects occur which hinder the potential measurement. These effects include electrical and/or magnetic interference or stray fields which emanate from bonding wires or high-voltage leads in the proximity of the measurement and deflect the electron beam transversely to the time axis t, i.e. in the direction of the X-axis. Consequently logic images 1″ according to FIG. 3 are produced, in which the conductive tracks 3″ which are otherwise straight display a lateral (spatial) displacement distortion $\Delta x$ in a time range $\Delta t_V$.

In the case of a quantitative signal measurement the electron beam does not scan the entire line II—II containing the point A but is directed statically onto the point A. However, this in turn can, in the event of great electrical and/or magnetic disturbances and a correspondingly great displacement $\Delta x$, lead to the electron beam being deflected in such a way that it slides down from the conductive track and thus makes a measurement completely impossible.

In the method according to the invention this hindrance is avoided by first of all carrying out the auxiliary measurement described above by scanning one single scan line II—II containing the relevant point A or another line running at right angles to the time axis. By this auxiliary measurement the apparent displacement $\Delta x$ of the conductive track 3″ is detected. As shown in FIG. 3, the apparent displacement Δx is time dependent and, therefore, is detected and stored in its time dependence during the auxiliary measurement by the detecting and storing apparatus 20 shown in FIG. 4.

In the principal measurement, which takes place during the same time range Δt of the program as the auxiliary measurement, the electron beam is directed statically onto the point A of the conductive track 3 (FIG. 1). From the aforementioned storage device 18 the stored displacement determined in the auxiliary measurement (in its space-time dependence) is supplied by a transferring assembly 22 as compensation value to the electron beam deflector 14, so that in the time range $\Delta t_V$ of the electrical and/or magnetic disturb-which occur a corresponding correction of the alignment of the electron beam takes place. In order to determine the compensation values an evaluation of successive image lines is carried out for example in the logic image 1" using the correlation method. In this case one-, two- or three-dimensional cross-correlation and auto-correlation calculations are applied in real space or Fourier space between individual or several successive data ranges.

In this way quantitatively high-value potential measurements can be carried out at individual particularly interesting points of an integrated circuit without them being influenced by electrical and/or magnetic disturbances.

The electron beam deflector 14 to which the compensation values are supplied in the form of correction currents or voltages can be formed in the conventional manner by deflection coils or deflection capacitors.

The auxiliary measurement of the method according to the invention does not have to take place on the same conductive track on which the principal measurement is carried out. It is sufficient to carry out the auxiliary measurement on a conductive track on which the same conditions occur as regards the displacement as on the conductive track to be studied in the principal measurement.

We claim:

1. Method of potential measurement on a conductive track of a program-controlled integrated circuit, in which the logic states occurring at specific points in time during a program loop are represented in a two-dimensional logic image by means of an electron beam which is pulsed with the repitition frequency of the program loop and the phase of which is continuously shifted, characterized by the following steps:
    (a) during a specific time range of the program, the integrated circuit is scanned by the electron beam along a scan line crossing at least one conductive track and spatial displacement of the conductive track occurring in the logic image as a result of electrical and/or magnetic disturbances is determined in its time dependence and stored;
    (b) then, during the same time range of the program, the electron beam is directed statically onto the conductive track to be measured, and the spatial displacement in its time dependence is used as a compensation value for correction of deflections of the electron beam caused by electrical and/or magnetic disturbances.

2. Method as claimed in claim 1, characterised in that the determination and quantitative analysis of the spatial displacement is achieved by evaluation of successive lines of the logic image according to a correlation method selected from one of multi-dimensional cross-correlation and auto-correlation calculations.

3. Apparatus for potential measurement on conductive tracks of a program-controlled integrated circuit, comprising
    a) an arrangement for producing a pulsed electron beam which can be adjusted in phase,
    b) an arrangement for focussing the electron beam onto the integrated circuit,
    c) a deflection arrangement for the electron beam for line-by-line scanning of the integrated circuit,
    d) a measurement and control sequence for detecting and evaluating secondary radiation which occurs,
    e) a display device for representing the logic states occurring at specific points in time in a two-dimensional logic image,
    f) an arrangement for detecting, evaluating and storing a spatial/temporal displacement, caused by electrical and/or magnetic disturbances, of the conductive tracks illustrated in the logic image, and
    g) an arrangement for transferring the stored displacement as a compensation value to the deflection arrangement.

* * * * *